United States Patent [19]

Newton

[11]  4,349,756
[45]  Sep. 14, 1982

[54] PHASE DETECTOR WITH LOW OFFSETS
[75] Inventor: Anthony D. Newton, Geneva, Switzerland
[73] Assignee: Motorola, Inc., Schaumburg, Ill.
[21] Appl. No.: 235,346
[22] Filed: Feb. 17, 1981
[51] Int. Cl.³ .................. H03K 5/26; G01R 25/00
[52] U.S. Cl. ............................ 307/514; 307/529; 307/246; 330/288
[58] Field of Search ............. 307/514, 516, 529, 246; 330/288

[56] References Cited

U.S. PATENT DOCUMENTS

| | | | |
|---|---|---|---|
| 2,989,652 | 6/1961 | Hall | 307/514 |
| 3,840,817 | 10/1974 | Seki | 307/514 |
| 3,870,965 | 3/1975 | Frederiksen | 330/288 |
| 4,001,603 | 1/1977 | Wilcox | 307/516 |
| 4,103,246 | 7/1978 | Limberg | 330/288 |
| 4,122,402 | 10/1978 | Main | 330/288 |

Primary Examiner—John S. Heyman
Attorney, Agent, or Firm—Joe E. Barbee

[57] ABSTRACT

A phase detector circuit has low offsets and is easily made as a bipolar integrated circuit. A first input to the phase detector controls a transistor which in turn controls a current source. The output of the current source is connected to a current mirror which has an NPN transistor. The current mirror is connected to ground by a transistor which is controlled by a second input signal. When the first input signal is present and is out of phase with the second input signal the output of the phase detector flows from the current source through the collector base junction of the NPN transistor. When both input signals are in phase the output of the phase detector serves as a current sink whose current carrying capabilities is controlled by the output of the current source.

10 Claims, 2 Drawing Figures

PHASE DETECTOR WITH LOW OFFSETS

This invention relates, in general, to phase detectors, and more particularly, to a phase detector having low offsets.

Phase detectors are widely used in electronic circuits in order to compare the phase of at least two signals. The phase detector typically provides an output signal which corresponds to the phase relationship of the signals being compared. An offset or unbalance is frequently encountered in bipolar integrated circuits. These offsets are often attributed to the use of PNP lateral transistors which have poor gain at high currents thereby causing a lack of balance at the output.

Accordingly, it is an object of the present invention to provide an improved phase detector circuit which has low offsets.

Another object of the present invention is to provide an improved phase detector which is capable of providing large output swings and large current ranges.

Yet another object of the present invention is to provide an improved phase detector which utilizes collector base conduction of a transistor with the emitter open.

Yet a further object of the present invention is to provide an improved phase detector circuit which uses PNP transistors in a manner in which the gain does not affect the balance of the phase detector.

SUMMARY

In carrying out the above and other objects of the present invention, there is provided a phase detector which has a first input, a second input, and an output. The phase detector includes a first means coupled to the first input for receiving a first input signal. Second means are coupled to the first means for providing a current controllable by the first means. Third means are coupled to the second means to receive the current provided by the second means. The third means is a current mirror which is also coupled to the output. A fourth means is coupled to the second input for receiving a second input signal. The fourth means is also coupled to the third means for controllably coupling the third means to a reference voltage terminal when the first input signal is in phase with the second input signal. The third means includes a transistor through which current can be provided to the output through the collector base junction of the transistor when the first input signal is present out of phase with the second input signal.

The exemplification set out herein illustrates a preferred embodiment of the invention in one form thereof, and such exemplification is not to be construed as limiting in any manner.

DETAILED DESCRIPTION OF THE DRAWINGS

Figure 1:
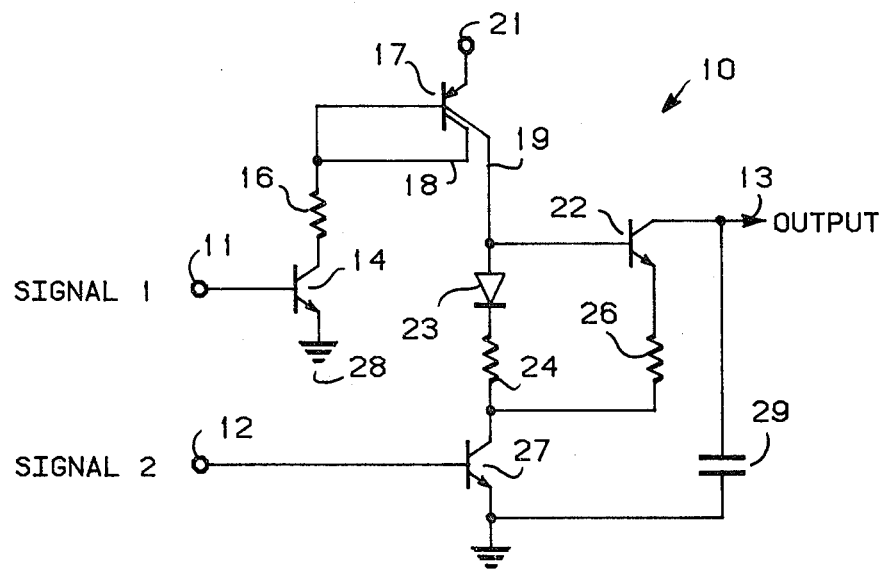
FIG. 1 illustrates, in schematic form, an embodiment of the present invention.

FIG. 1 illustrates a phase detector circuit 10 which can be made as an integrated circuit using bipolar transistors. Phase detector 10 has an input 11 for receiving an input signal 1, and an input 12 for receiving an input signal 2. The output of the phase detector appears at 13. Input 11 is connected to the base electrode of an NPN transistor 14. The emitter of transistor 14 is connected to a voltage terminal 28, illustrated as ground. The collector of transistor 14 is connected to resistor 16. Resistor 16 is also connected to the base electrode of a PNP transistor 17. Transistor 17 has two collectors 18 and 19. Collector 18 is connected to the base electrode of transistor 17 while collector 19 is connected to the base electrode of an NPN transistor 22. The emitter of transistor 17 is connected to voltage terminal 21. Transistor 17 serves as a current source transistor.

Transistor 22 has a collector connected to output 13, and an emitter connected to resistor 26. The base electrode of transistor 22 is also connected to the anode of a diode 23. The cathode of diode 23 is connected to a resistor 24. Resistors 24 and 26 are connected together to the collector of an NPN transistor 27. The emitter of transistor 27 is connected to voltage terminal 28 illustrated as ground. The base electrode of transistor 27 is connected to input 12. A capacitor 29 is connected from output 13 to voltage terminal 28 and serves as an output filter.

Transistors 14 and 27 serve as switches which are controlled by input signals 1 and 2, respectively. If transistors 14 and 27 are both conductive, the current from current source transistor 17 is mirrored by the combination of diode 23, resistor 24, transistor 22 and resistor 26 so that an amount of current is drawn from the output filter which is equal to the current provided by transistor 17 through collector 19. If transistor 14 is conductive and transistor 27 is non-conductive, then the current from transistor 17 will forward bias the collector base junction of transistor 22 so that the current from transistor 17 flowing through collector 19 flows into the output filter. To avoid the loss of current to the integrated circuit chip's substrate, under this condition, transistor 22 should be constructed with a guard ring. The guard ring could be eliminated by adding a diode from collector 19 to the collector of transistor 22 and adding a diode in the line from collector 19 to the base of transistor 22.

If transistor 14 is non-conductive then no current flows to or from the output filter regardless of the conductive state of transistor 27. Depending on the relative phases of signal 1 and signal 2 current can flow into or out of the output filter, thus, the circuit functions as a phase detector.

The gain of phase detector 10 is proportional to the current that flows in transistor 17, however, this current does not directly change the balance of the phase detector. Since in one case the current from collector 19 flows to the output filter and in the other case the current from collector 19 sets up a current mirror which allows a current equal to the current in collector 19 to flow from the output filter, the balance of phase detector 10 is maintained. The balance of phase detector 10 is affected by the accuracy of the current mirror comprising diode 23, resistor 24, resistor 26, and transistor 22. The balance is also affected by charge storage on transistors 14 and 27 which may therefore be required to be non-saturating transistors.

Phase detector 10 avoids the usual causes of unbalance encountered in bipolar integrated circuit phase detectors. In addition, phase detector 10 is suitable for large current ranges and high output voltage swings, such as may be required, for example, in a television horizontal oscillator phase locked loop. Therefore, phase detector 10 is highly suitable for use in a television horizontal oscillator phase locked loop. Offsets in many forms of phase detectors having bipolar transistors are caused by the use of PNP lateral transistors which have poor gain at high currents thereby causing a lack of balance at the output. Phase detector 10 uses PNP transistors in a manner in which their gain does not effect the balance of the phase detector. The only critical matching of transistors is in the NPN current mirror and such matching is relatively easy to achieve.

Figure 2:
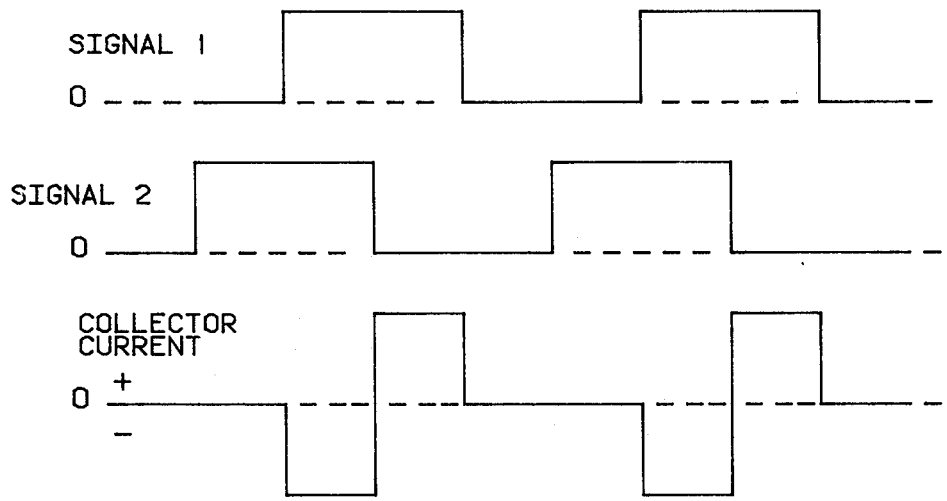
FIG. 2 shows some signal waveforms useful in understanding the operation of the circuit of FIG. 1.

Three waveforms are illustrated in FIG. 2. The top waveform labeled SIGNAL 1 represents a type of signal that would appear at input 11 of phase detector 10. The second waveform is labeled SIGNAL 2 and is a type of signal that would appear at input 12. The bottom waveform is labeled COLLECTOR CURRENT and represents the current flowing in the collector of transistor 22. Positive collector current is current that charges the output filter positive, while the negative collector current is the current that is removed from the output filter. The peak current is determined by resistor 16, transistor 14 and transistor 17.

When signal 1 and signal 2 are in phase, the collector current from transistor 22 is illustrated as being negative which means that current from the output filter flows down through transistor 22 through resistor 26 and through transistor 27 to ground 28. The amount of current that flows is controlled by the current mirror which in turn is controlled by the current from collector 19. When signal 1 enables transistor 14 while signal 2 is incapable of enabling transistor 27 then the collector output current is positive which means that the current from collector 19 flows through the collector base junction of transistor 22 into the output filter. When signal 1 does not enable transistor 14, no current flows in the collector of transistor 22.

By now it should be appreciated that there has been provided an improved phase detector circuit which does not suffer from the usual causes of offsets or unbalance encountered in bipolar integrated circuits. This phase detector is suitable for large current ranges and high output voltage swings.

I claim:

1. A phase detector circuit with low offsets and having a first signal input, a second signal input and an output, the phase detector comprising: a first transistor having a control electrode coupled to the first input, having a first electrode coupled to a reference voltage terminal, and having a second electrode; current source means for providing a current and being controlled by the first transistor and being coupled to the second electrode of the first transistor; a current mirror coupled to the current source means for receiving the current from the current source means, the current mirror being coupled to the output; and a second transistor having a base electrode coupled to the second input, having an emitter electrode coupled to the reference voltage terminal, and having a collector electrode coupled to the current mirror whereby an in-phase condition at said phase detector inputs causes the current from said current source to be mirrored by said current mirror.

2. The phase detector circuit of claim 1 further including a first resistor coupled between the second electrode of the first transistor and the current source means.

3. The phase detector circuit of claim 2 wherein the current source means includes a transistor having a control electrode coupled to the first resistor, having a first electrode coupled to a voltage terminal, having a second electrode coupled to the current mirror, and having a third electrode coupled to the first resistor.

4. The phase detector circuit of claim 3 wherein the current mirror includes a transistor having its control electrode coupled to the second electrode of the current source means transistor, having a first electrode, and having a second electrode coupled to the output; a second resistor coupled between the first electrode of the current mirror transistor and the second electrode of the second transistor; a diode coupled to the control electrode of the current mirror transistor; and a third resistor coupled between the diode and the second electrode of the second transistor.

5. The phase detector circuit of claim 4 further including a capacitor coupled between the output and the reference voltage terminal.

6. The phase detector circuit of claim 4 wherein the first and second transistors are NPN transistors, the current source transistor is a PNP transistor having at least two collectors, and the current mirror transistor is an NPN transistor.

7. A phase detector circuit having a first input, a second input, and an output, the phase detector circuit comprising:
first means coupled to the first input for receiving a first input signal; second means coupled to the first means for providing a current controllable by the first means; third means coupled to the second means and providing a current mirror, the third means also being coupled to the output; and fourth means coupled to the second input and to the third means for controllably coupling the third means to a reference voltage terminal when the first input signal is in phase with a signal appearing at the second input whereby current from said second means is mirrored by said third means.

8. The phase detector circuit of claim 7 further having a capacitor coupled between the output and the reference voltage terminal, and wherein an output current is supplied to the output terminal when the first signal is present out of phase with the signal appearing at the second input.

9. The phase detector circuit of claim 7 wherein the third means includes a transistor having at least a base and a collector wherein current can be provided to the output through the collector base junction when the first signal is present and is out of phase with the signal appearing at the second input.

10. The phase detector circuit of claim 9 wherein the transistor is constructed with a guard ring to prevent loss of current to substrate when the base collector junction is providing current to the output.

* * * * *